(12) United States Patent
Ramaswamy

(10) Patent No.: US 10,431,695 B2
(45) Date of Patent: Oct. 1, 2019

(54) TRANSISTORS COMPRISING AT LEASE ONE OF GAP, GAN, AND GAAS

(71) Applicant: Micron Technology, Inc., Boise, ID (US)

(72) Inventor: Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/848,982

(22) Filed: Dec. 20, 2017

(65) Prior Publication Data

US 2019/0189807 A1 Jun. 20, 2019

(51) Int. Cl.
*H01L 29/49* (2006.01)
*H01L 27/115* (2017.01)
(Continued)

(52) U.S. Cl.
CPC .. *H01L 29/78696* (2013.01); *H01L 29/42392* (2013.01); *H01L 29/4908* (2013.01);
(Continued)

(58) Field of Classification Search
CPC ............... H01L 29/78681; H01L 21/823412
See application file for complete search history.

(56) References Cited

U.S. PATENT DOCUMENTS

| | | |
|---|---|---|
| 4,237,473 A | 12/1980 | Chiang |
| 5,138,407 A | 9/1992 | Hirtz et al. |

(Continued)

FOREIGN PATENT DOCUMENTS

| | | |
|---|---|---|
| EP | 1936696 | 6/2008 |
| KR | 10-2017-0019668 | 2/2017 |

(Continued)

OTHER PUBLICATIONS

Baliga et al. "Seminconductors for high-voltage, vertical channel field effect transistors", Journal of Applied Physics 53(3), Mar. 1982, United States, pp. 1759-1764.

(Continued)

*Primary Examiner* — Farun Lu
(74) *Attorney, Agent, or Firm* — Wells St John P.S.

(57) ABSTRACT

A transistor comprises a pair of source/drain regions having a channel region there-between. A transistor gate construction is operatively proximate the channel region. The channel region comprises a direction of current flow there-through between the pair of source/drain regions. The channel region comprises at least one of GaP, GaN, and GaAs extending all along the current-flow direction. Each of the source/drain regions comprises at least one of GaP, GaN, and GaAs extending completely through the respective source/drain region orthogonal to the current-flow direction. The at least one of the GaP, the GaN, and the GaAs of the respective source/drain region is directly against the at least one of the GaP, the GaN, and the GaAs of the channel region. Each of the source/drain regions comprises at least one of elemental silicon and metal material extending completely through the respective source/drain region orthogonal to the current-flow direction. Other embodiments are disclosed.

28 Claims, 8 Drawing Sheets

(51) Int. Cl.
*H01L 29/423* (2006.01)
*H01L 29/786* (2006.01)

(52) U.S. Cl.
CPC .. *H01L 29/78618* (2013.01); *H01L 29/78642* (2013.01); *H01L 29/78681* (2013.01); *H01L 27/115* (2013.01)

(56) References Cited

U.S. PATENT DOCUMENTS

| | | | |
|---|---|---|---|
| 5,714,777 | A | 2/1998 | Ismail et al. |
| 5,930,611 | A | 7/1999 | Okamoto |
| 7,071,065 | B1 | 7/2006 | Xiang et al. |
| 7,125,815 | B2 | 10/2006 | Vaartstra |
| 7,393,783 | B2 | 7/2008 | Derderian |
| 7,402,504 | B2 | 7/2008 | Brabant et al. |
| 7,514,372 | B2 | 4/2009 | Arena et al. |
| 7,537,804 | B2 | 5/2009 | Srividya et al. |
| 7,544,388 | B2 | 6/2009 | Sarigiannis et al. |
| 7,682,947 | B2 | 3/2010 | Brabant et al. |
| 7,851,307 | B2 | 12/2010 | Ramaswamy et al. |
| 7,928,427 | B1 | 4/2011 | Chang |
| 8,163,341 | B2 | 4/2012 | Quick et al. |
| 8,431,459 | B2 | 4/2013 | Takenaka et al. |
| 8,481,122 | B2 | 7/2013 | Carlson et al. |
| 8,518,486 | B2 | 8/2013 | Mirin et al. |
| 8,536,621 | B2 | 9/2013 | Dewey et al. |
| 8,748,269 | B2 | 6/2014 | Dewey et al. |
| 8,823,011 | B2 | 9/2014 | Chan |
| 9,218,963 | B2 | 12/2015 | Matero |
| 9,499,907 | B2 | 11/2016 | Song et al. |
| 10,096,710 | B2 | 10/2018 | Wu et al. |
| 2001/0048119 | A1 | 12/2001 | Mizuno et al. |
| 2002/0028531 | A1 | 3/2002 | Wang et al. |
| 2005/0023555 | A1 | 2/2005 | Yoshida et al. |
| 2005/0159017 | A1 | 7/2005 | Kim et al. |
| 2005/0280052 | A1 | 12/2005 | Holz et al. |
| 2006/0214236 | A1 | 9/2006 | Chien |
| 2006/0216894 | A1 | 9/2006 | Parekh et al. |
| 2007/0032029 | A1 | 2/2007 | Chow et al. |
| 2007/0243688 | A1 | 10/2007 | Liao |
| 2007/0246803 | A1 | 10/2007 | Haller |
| 2008/0085587 | A1 | 4/2008 | Wells |
| 2008/0169485 | A1 | 7/2008 | Heyns et al. |
| 2009/0045411 | A1 | 2/2009 | Lin et al. |
| 2009/0179227 | A1* | 7/2009 | Otake ............... H01L 29/7813 257/192 |
| 2010/0052039 | A1 | 3/2010 | Matsushita et al. |
| 2010/0109051 | A1 | 5/2010 | Wu et al. |
| 2010/0155790 | A1 | 6/2010 | Lin et al. |
| 2010/0276668 | A1 | 11/2010 | Ko et al. |
| 2010/0308379 | A1 | 12/2010 | Kuan et al. |
| 2011/0084284 | A1 | 4/2011 | Zhang et al. |
| 2011/0108885 | A1 | 5/2011 | Sazawa et al. |
| 2011/0227145 | A1 | 9/2011 | Renn |
| 2012/0080753 | A1 | 4/2012 | Singh et al. |
| 2012/0256259 | A1 | 10/2012 | Surthi et al. |
| 2012/0298958 | A1 | 11/2012 | Dewey et al. |
| 2013/0149830 | A1 | 6/2013 | Rhee et al. |
| 2013/0193400 | A1* | 8/2013 | Sandhu ............... H01L 27/2454 257/5 |
| 2013/0233240 | A1 | 9/2013 | Cody et al. |
| 2013/0307025 | A1 | 11/2013 | Pal et al. |
| 2013/0337623 | A1 | 12/2013 | Dewey et al. |
| 2014/0315364 | A1 | 10/2014 | Guha et al. |
| 2015/0004805 | A1 | 1/2015 | Omstead et al. |
| 2015/0028406 | A1 | 1/2015 | Tang et al. |
| 2015/0091060 | A1* | 4/2015 | Yang ............... H01L 29/66431 257/194 |
| 2015/0093868 | A1 | 4/2015 | Obradovic et al. |
| 2015/0137268 | A1 | 5/2015 | Fung |
| 2015/0155381 | A1 | 6/2015 | Song |
| 2016/0099143 | A1 | 4/2016 | Yan et al. |
| 2016/0204202 | A1 | 7/2016 | Jain |
| 2017/0345927 | A1* | 11/2017 | Cantoro ............ H01L 21/30612 |
| 2018/0230591 | A1 | 8/2018 | Jang et al. |

FOREIGN PATENT DOCUMENTS

KR 10-0560654 2/2017
WO PCT/US2018/062475 3/2019

OTHER PUBLICATIONS

Kang et al., "Change in Electrical Characteristics of Gallium Phosphide Nanowire Transistors Under Different Environments", 4th IEEE Conference on Nanotechnology, Aug. 16-19, 2004, Published in United States, pp. 370-372.
Pal et al., "Addressing Key Challenges in 1T-DRAM: Rention Time, Scaling and Varability—Using a Novel Design with GaP Source-Drain", IEEE, 2013, United States, pp. 376-379.
U.S. Appl. No. 15/843,402, filed Dec. 15, 2017, by Carlson et al.
U.S. Appl. No. 62/537,842, filed Jul. 27, 2017, by Sandhu et al.
Kotulak, "Growth and Anaylsis of Gallium Phosphide on Silicon for Very High Efficiency Solar Cells", A thesis by the Faculty of the Univ. of Delaware in partial fulfillment of the requirements for the degree of Master of Science in Electrical and Computer Engineering, Univ. of Delaware, 2011, 83 pages.
Manna et al., "A Novel Si/SiGe Sandwich Polysilicon TFT for SRAM Applications", IEEE, Jun. 19-21, 1995, United States, pp. 156-157.
Ozturk, "Source/Drain Junctions and Contacts for 45 nm CMOS and Beyond", North Carolina State University Department of Electrical and Computer Engineering, 2005 International Conference on Characterization and Metrology for USLI Technology, 2005, United States, 34 pages.
Pal et al., "Electrical Characterization of GaP-Silicon Interface for Memory and Transistor Applications", IEEE Transactions on Electron Devices, vol. 60, No. 7, Jul. 2013, United States, pp. 2238-2245.
Sun, "Power Metal-Oxide-Semiconductor Field-Effect Transistor With Strained Silicon and Silicon Germanium Channel", A Dissertation Sumitted for the Degree of Doctor of Philosophy in the Dept. of Elec. Eng. in the College of Eng. and Comp. Science, Univ. of Florida, 2010, 104 pgs.
U.S. Appl. No. 15/898,086, filed Feb. 15, 2018, by Gao et al.
U.S. Appl. No. 15/860,388, filed Jan. 2, 2018, by Smythe et al.
U.S. Appl. No. 15/890,147, filed Feb. 6, 2018, by Ramaswamy.

* cited by examiner

TRANSISTORS COMPRISING AT LEASE ONE OF GAP, GAN, AND GAAS

TECHNICAL FIELD

Embodiments disclosed herein pertain to transistors comprising at least one of GaP, GaN, and GaAs.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, or sense lines) and access lines (which may also be referred to as word lines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates, and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Transistors may be used in circuitry other than memory circuitry.

DETAILED DESCRIPTION OF EXAMPLE EMBODIMENTS

Figure 1:
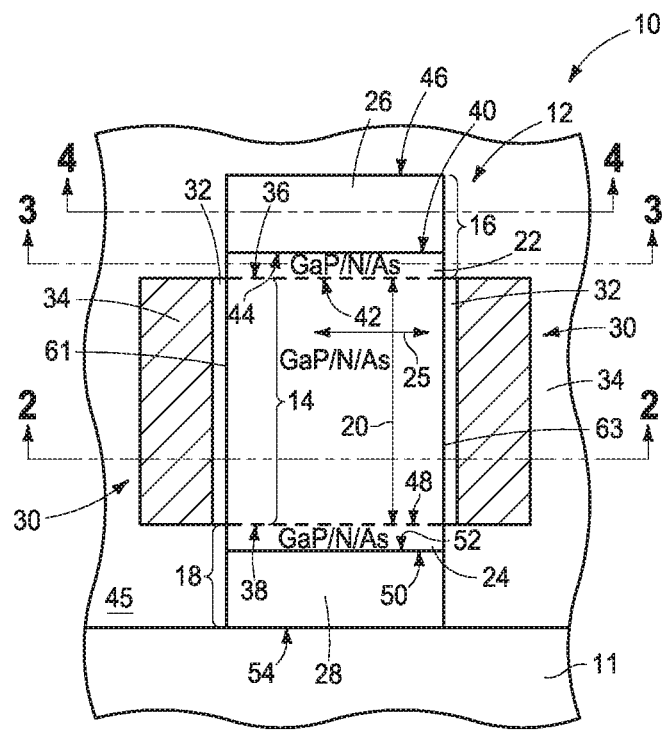
FIG. 1 is a diagrammatic cross-sectional view of a transistor in accordance with an embodiment of the invention, and is taken through line 1-1 in FIGS. 2-4.
Figure 2:
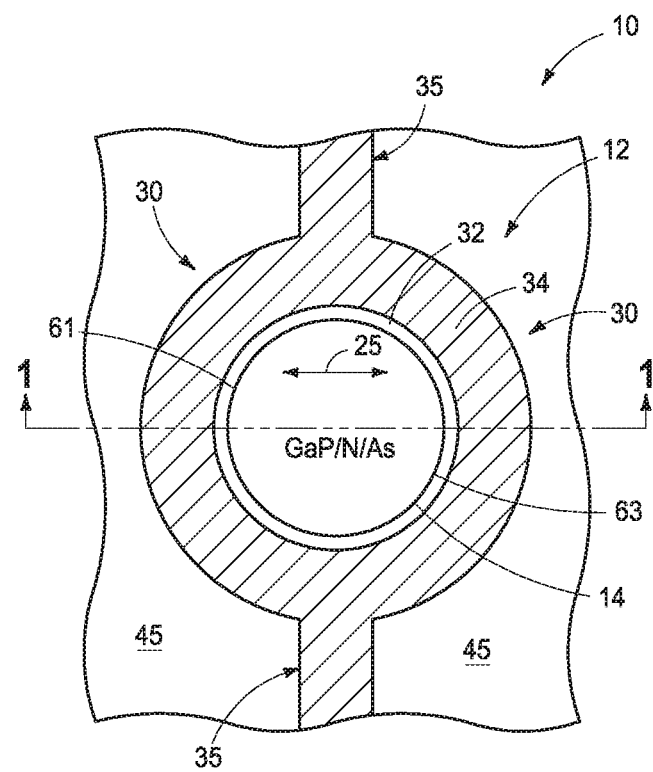
FIG. 2 is a cross-sectional view taken through line 2-2 in FIG. 1.
Figure 3:
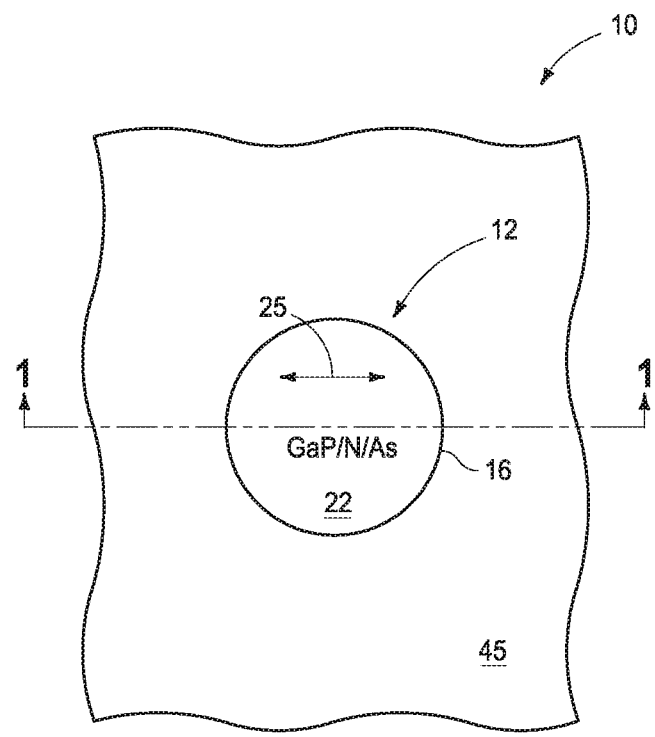
FIG. 3 is a cross-sectional view taken through line 3-3 in FIG. 1.
Figure 4:
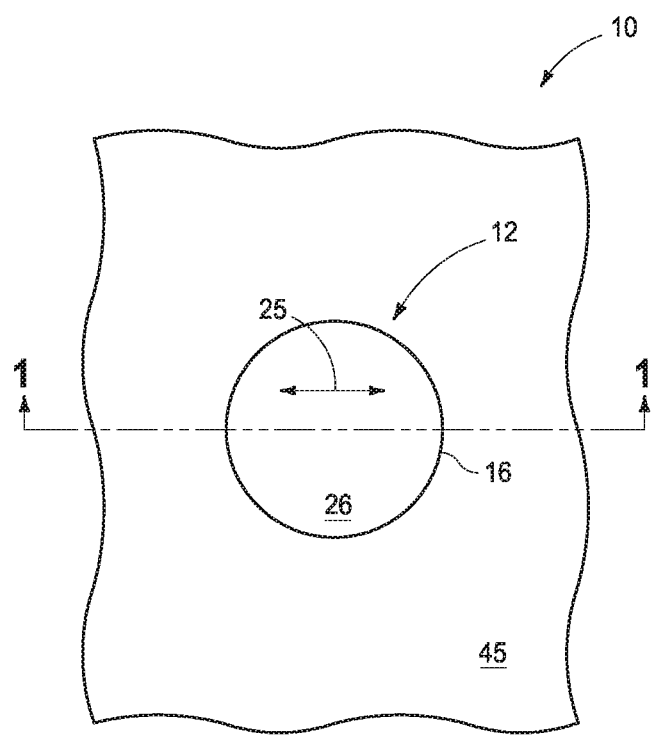
FIG. 4 is a cross-sectional view taken through line 4-4 in FIG. 1.

Embodiments of the invention encompass transistors, arrays of transistors, and devices comprising one or more transistors. First example embodiments are described with reference to FIGS. 1-4. A substrate fragment, construction, or device 10 comprises a base substrate 11 that may include any one or more of conductive/conductor/conducting (i.e., electrically herein), semiconductive/semiconductor/semi-conducting, or insulative/insulator/insulating (i.e., electrically herein) materials. Various materials have been formed elevationally over base substrate 11. Materials may be aside, elevationally inward, and/or elevationally outward of the FIGS. 1-4 depicted materials. For example, other partially or wholly fabricated components of integrated circuitry may be provided somewhere above, about, and/or within base substrate 11. Control and/or other peripheral circuitry for operating components within an array of transistors may also be fabricated, and may or may not be wholly or partially within a transistor array or sub-array. Further, multiple sub-arrays may also be fabricated and operated independently, in tandem, or otherwise relative one another. As used in this document, a "sub-array" may also be considered as an array.

Construction 10 comprises a transistor 12 comprising a pair of source/drain regions 16, 18 having a channel region 14 there-between. A transistor gate construction 30 is operatively proximate channel region 14. Gate construction 30 comprises conductive gate material 34 (e.g., conductively-doped semiconductor material and/or metal material) and gate insulator 32 (e.g., silicon dioxide, silicon nitride and/or other high k dielectric, ferroelectric material, and/or other programmable material, etc.) Gate material 34 may comprises part of an access line 35 (FIG. 2) that interconnects gates of multiple transistors together in an individual row or column. Channel region 14 comprises a direction 20 of current flow (i.e., a current-flow direction) there-through between pair of source/drain regions 16 and 18. In one embodiment and as shown, current-flow direction 20 is straight-linear everywhere between source/drain regions 16 and 18 and may be considered as a plane (e.g., the plane of the page upon which FIG. 1 lies between the depicted two opposing gate insulators 32). Channel region 14 comprises at least one of GaP, GaN, and GaAs (collectively designated by the abbreviation "GaP/N/As" in the figures) extending all along current-flow direction 20. Channel region 14 may comprise, consist essentially of, or consist of the at least one of GaP, GaN, and GaAs. In one embodiment, channel region 14 comprises, consists essentially of, or consists of GaP extending all along current-flow direction 20, in one embodiment comprises, consists essentially of, or consists of GaN extending all along current-flow direction 20, and in one embodiment comprises, consists essentially of, or consists of GaAs extending all along current-flow direction 20. In one embodiment, channel region 14 comprises, consists essentially of, or consists of all three of GaP, GaN, and GaAs extending all along current-flow direction 20.

Each of source/drain regions 16, 18 comprises at least one of GaP, GaN, and GaAs extending completely through the respective source/drain region orthogonal to current-flow direction 20, such as along an orthogonal direction 25 (e.g., which may be a plane) as shown in FIGS. 1-4. For example, source/drain region 16 comprises a region or portion 22 comprising, consisting essentially of, or consisting of at least one of GaP, GaN, and GaAs extending completely through the respective source/drain region along orthogonal direction 25. Source/drain region 18 comprises a region or portion 24 comprising, consisting essentially of, or consisting of at least one of GaP, GaN, and GaAs extending completely through the respective source/drain region along orthogonal direction 25. Regardless, the at least one of the GaP, the GaN, and the GaAs of the respective source/drain region 16 or 18 is directly against the at least one of the GaP, the GaN, and the GaAs of channel region 14. In one embodiment, channel region 14 as respects GaP, GaN, and GaAs comprises only one of the GaP, the GaN, and the GaAs extending all along current-flow direction 20, and, as respects GaP, GaN, and GaAs, each of source/drain regions 16 and 18 comprises only one other of the GaP, the GaN, and the GaAs extending completely through the respective source/drain region 16 or 18 along orthogonal direction 25.

Each of source/drain regions 16 and 18 comprises at least one of elemental silicon and metal material extending completely through the respective source/drain region orthogonal to current-flow direction 20. For example and as shown, source/drain region 16 comprises a region or portion 26 comprising, consisting essentially of, or consisting of at least one of elemental silicon and metal material, and source/drain region 18 comprises a region or portion 28 comprising, consisting essentially of, or consisting of at least one of elemental silicon and metal material. In one embodiment, the at least one of the elemental silicon and the metal material of the respective source/drain region is directly against the at least one of the GaP, the GaN, and the GaAs of the respective source/drain region. In one embodiment, source/drain regions 16 and 18 each comprise, consist essentially of, or consist of elemental silicon. In one embodiment, source/drain region 16 and 18 each comprise, consist essentially of, or consist of metal material. In one embodiment, one of source/drain regions 16 or 18 comprises elemental silicon and the other source/drain region 16 or 18 comprises metal material. A dielectric material 45 (e.g., silicon dioxide and/or silicon nitride) is shown above and aside the various operative features in FIGS. 1-4.

Portions 22, 26, 24, and 28 of source/drain regions 16 and 18, by way of example, may be heavily doped with a conductivity-enhancing impurity (e.g., any part of portions 26 and 28 that are not metal material) to be electrically conductive, for example having a dopant concentration of at least $10^{20}$ atoms/cm$^3$. Channel region 14 may be suitably doped with a conductivity-modifying impurity likely of the opposite conductivity-type of the dopant in regions 22, 26, 24, and 28, and for example to a channel dopant concentration less than or equal to about $10^{16}$ atoms/cm$^3$. Source/drain regions 16 and 18 may include other doped regions (not shown), for example halo regions, LDD regions, etc.

The above-described and depicted materials, regions, and portions may be of any suitable respective thicknesses not particularly material to the invention. Yet, in one embodiment, transistor 12 is a thin-film transistor.

In one embodiment, transistor 12 extends elevationally, and in one such embodiment as shown is vertical or within 10° of vertical. Specifically, and in such an example, source/drain region 16 is an upper source/drain region and source/drain region 18 is a lower source/drain region. Channel region 14 extends elevationally there-between, and comprises a top 36 (i.e., an uppermost extent) and a bottom 38 (i.e., a lowermost extent) each of which comprises at least one of GaP, GaN, and GaAs. Further, in such an embodiment, portion 22 of upper source/drain region 16 is a lowermost portion thereof and which comprises a top 40 and a bottom 42 each comprising at least one of GaP, GaN, and GaAs, with bottom 42 being directly against the at least one of the GaP, the GaN, and the GaAs of top 36 of channel region 14. In one embodiment and as shown, top 36 of channel region 14 and bottom 42 of lowermost portion 22 may be planar and elevationally coincident along orthogonal direction 25. Portion 26 is an uppermost portion of upper source/drain region 16 and which comprises a top 46 and a bottom 44.

Portion 24 of lower source/drain region 18 comprises an uppermost portion thereof and which comprises a top 48 and a bottom 50 each comprising at least one of GaP, GaN, and GaAs. Top 48 is directly against the at least one of the GaP, the GaN, and the GaAs of bottom 38 of channel region 14. In one embodiment and as shown, bottom 38 of channel region 14 and top 48 of lowermost portion 22 may be planar and elevationally coincident along orthogonal direction 25. Portion 28 is a lowermost portion of lower source/drain region 18 and which comprises a top 52 and a bottom 54. Top 52 comprises at least one of elemental silicon and metal material directly against the at the least one of the GaP, the GaN, and the GaAs of bottom 50 of uppermost portion 24 of lower source/drain region 18. Source/drain regions 16, 18 and channel region 14 are shown as being circular in horizontal cross-section, although other shapes of the various regions (e.g., elliptical, square, rectangular, triangular, pentagonal, etc.) may be used and all need not be of the same shape relative one another.

As an alternate example, transistor 12 may not be elevationally-extending, for example being horizontally-extending. Specifically, and by way of example, rotating any of FIGS. 1-4 90° to the right or left depicts a horizontally-extending transistor regardless of position or composition of example substrate material 11. Regardless, any other attribute(s) or aspect(s) as shown and/or described herein with respect to other embodiments may be used regardless of vertical, horizontal, or other orientation of the transistor.

In one embodiment, gate construction 30 is over laterally-opposing sides of channel region 14 (e.g., sides 61 and 63) in straight-line vertical cross-section (e.g., the vertical cross-section of FIG. 1 and regardless of whether appearing in portrait, landscape, or any other rotated orientation of the plane of the paper or visual representation upon which FIG. 1 lies). In one embodiment and as shown, gate construction 30 completely encircles channel region 14 in all straight-line vertical cross-sections as is inherently shown in viewing FIGS. 1 and 2 collectively.

Figure 5:
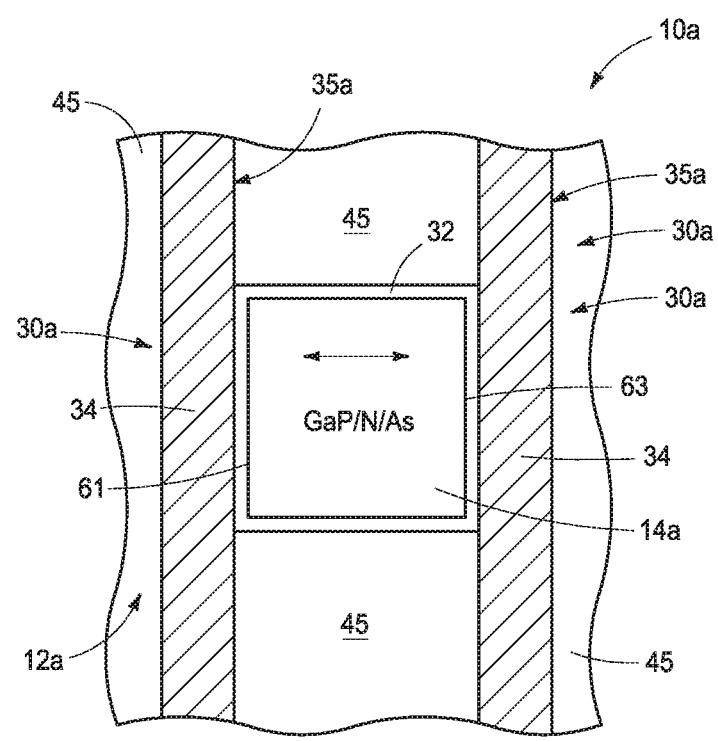
FIG. 5 is a diagrammatic cross-sectional view of a transistor in accordance with an embodiment of the invention.

FIG. 5 shows an alternate example embodiment construction 10a. Like numerals from the above-described embodiments have been used where appropriate, with some construction differences being indicated with the suffix "a". Gate construction 30a of transistor 12a does not completely encircle channel region 14a, rather and alternately with gate construction 30a being over only two laterally-opposing sides 61, 63 of channel region 14a in straight-line vertical cross-section. Such may be part of access line constructions 35a, and which may or may not be directly electrically coupled together. Any other attribute(s) or aspect(s) as shown and/or described herein with respect to other embodiments may be used.

Figure 6:
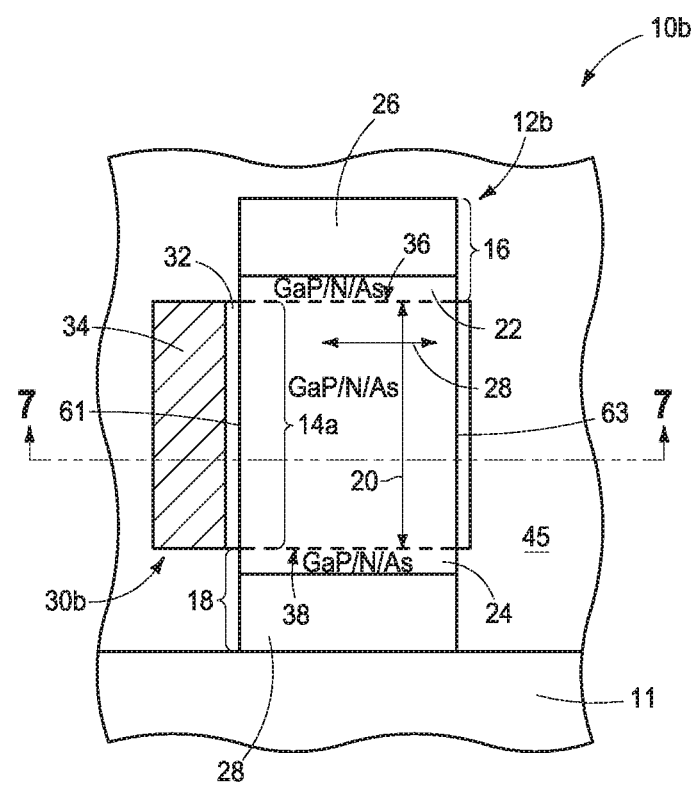
FIG. 6 is a diagrammatic cross-sectional view of a transistor in accordance with an embodiment of the invention, and is taken through line 6-6 in FIG. 7.
Figure 7:
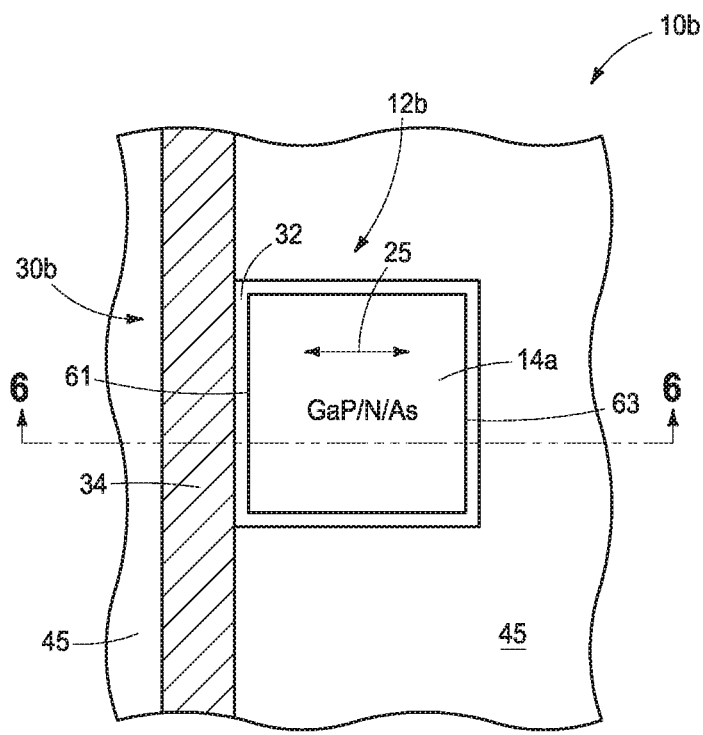
FIG. 7 is a cross-sectional view taken through line 7-7 in FIG. 6.

FIGS. 6 and 7 show yet another alternate example embodiment construction 10b wherein a gate construction 30b of transistor 12b is over only one lateral side (e.g., side 61) of channel region 14a in straight-line vertical cross-section. Like numerals from the above-described embodiments have been used where appropriate, with some construction differences being indicated with the suffix "b". Any other attribute(s) or aspect(s) as shown and/or described herein with respect to other embodiments may be used.

Figure 8:
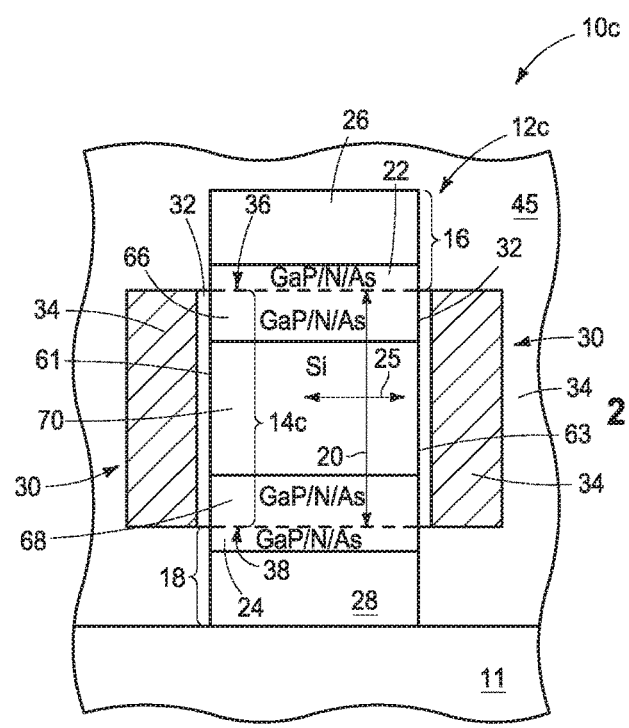
FIG. 8 is a diagrammatic cross-sectional view of a transistor in accordance with an embodiment of the invention.

A construction 10c comprising another transistor 12c in accordance with an embodiment of the invention is next described with reference to FIG. 8. Like numerals from the above-described embodiments have been used where appropriate, with some construction differences being indicated with the suffix "c" or with different numerals. Channel region 14c of transistor 12c in current-flow direction 20 comprises a pair of outer regions 66, 68 in current-flow direction 20 having an intervening region 70 there-between. Each of outer regions 66, 68 comprises, consists essentially of, or consists of at least one of GaP, GaN, and GaAs extending completely through channel region 14c in orthogonal direction 25. Intervening region 70 comprises elemental silicon extending completely through channel region 14c in orthogonal direction 25.

Each of source/drain regions 16 and 18 comprises at least one of GaP, GaN, and GaAs directly against the at least one of the GaP, the GaN, and the GaAs of one of outer regions 66 or 68 of channel region 14c. Each of source/drain regions 16 and 18 comprises elemental silicon outward in current-flow direction 20 of the at least one of the GaP, the GaN, and the GaAs of the respective source/drain region. For example, source/drain region 16 comprises elemental silicon 26 in current-flow direction 20 outward of at least one of the GaP, the GaN, and the GaAs of region 22 of source/drain region 16. Additionally, source/drain region 18 comprises elemental silicon 28 outward in current-flow direction 20 of at least one of the GaP, the GaN, and the GaAs of region 24 of source/drain region 18. In one embodiment and as shown, the elemental silicon of each of the respective source/drain regions is directly against at least one of the GaP, the GaN, and the GaAs of the respective source/drain region. Any other attribute(s) or aspect(s) as shown and/or described herein with respect to other embodiments may be used. For example, and by way of example only, a transistor in accordance with the example embodiment depicted by FIG. 8 could be other than elevationally-extending.

Figure 9:
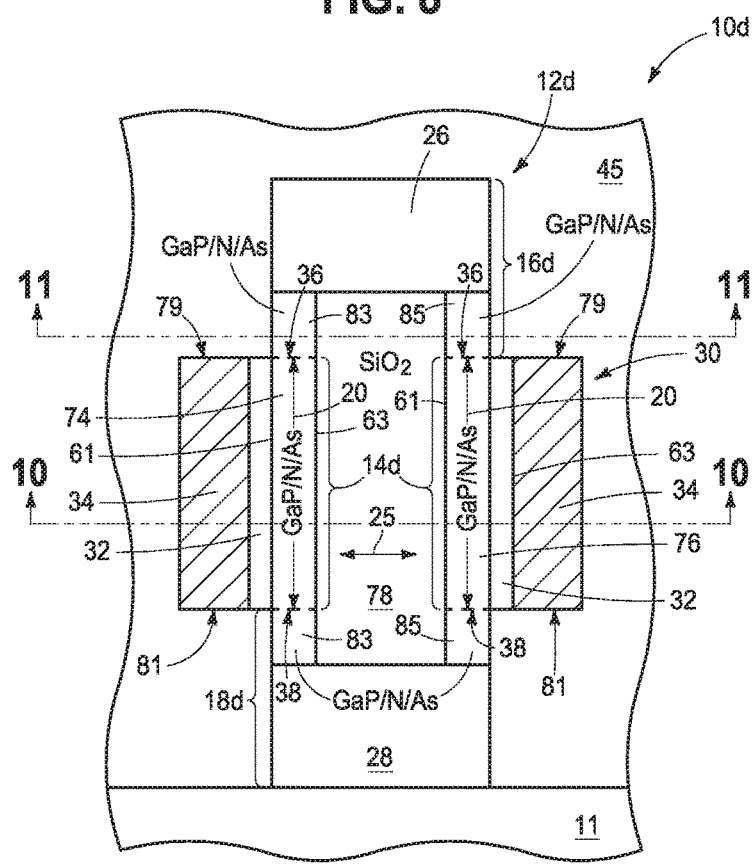
FIG. 9 is a diagrammatic cross-sectional view of a transistor in accordance with an embodiment of the invention, and is taken through line 9-9 in FIGS. 10 and 11.
Figure 10:
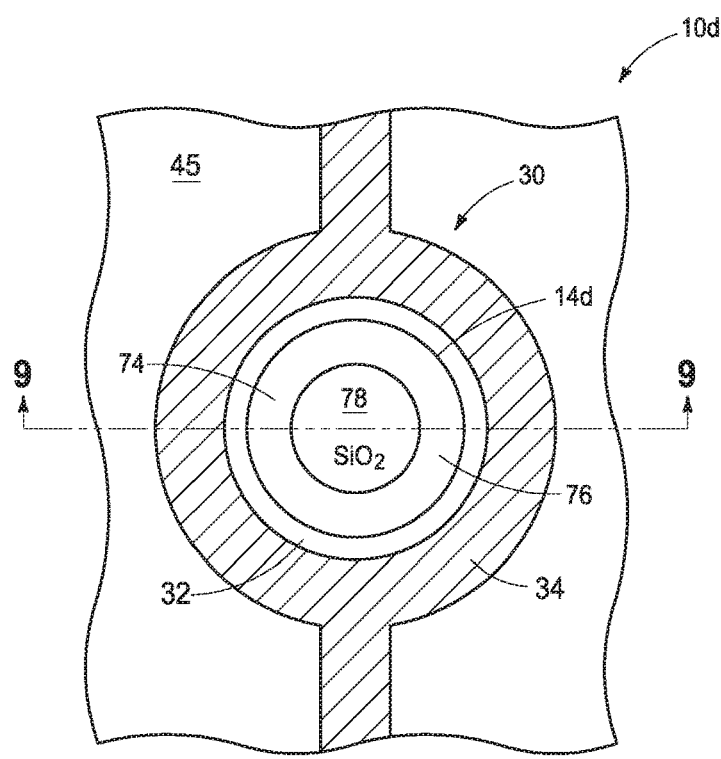
FIG. 10 is a cross-sectional view taken through line 10-10 in FIG. 9.
Figure 11:
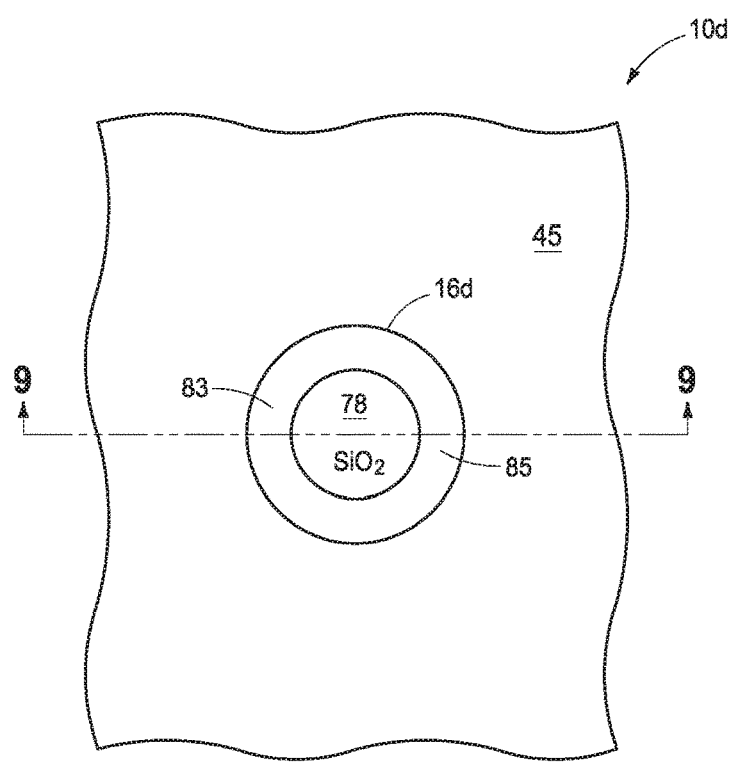
FIG. 11 is a cross-sectional view taken through line 11-11 in FIG. 9.

Another alternate construction 10d comprising another example transistor 12d in accordance with an embodiment of the embodiment of the invention is next described with reference to FIGS. 9-11. Like numerals from the above-described embodiments have been used where appropriate, with some construction differences being indicated with the suffix "d" or with different numerals. Channel region 14d of transistor 12d has opposing side regions 74, 76 in vertical cross-section (i.e., regardless of whether the transistor is elevationally-extending, horizontally-extending, or otherwise) all along current-flow direction 20. Opposing side regions 74 and 76 each comprise at least one of GaP, GaN, and GaAs extending all along current-flow direction 20. Transistor gate construction 30 is operatively proximate each of opposing side regions 74 and 76. An insulator intervening region 78 extends all along current-flow direction 20 between opposing side regions 74 and 76 in the vertical cross-section. Intervening region 78 being an insulator is inoperative in functioning as channel material and accordingly is not part of the channel region of transistor 12d. In one embodiment, insulator intervening region 78 comprises, consists essentially of, or consists of $SiO_2$. In one embodiment, opposing side regions 74, 76 in one of vertical cross-section or horizontal cross-section are in the form of an annulus. In one embodiment, opposing side regions 74, 76 each have maximum thickness of no greater than 150 Angstroms.

In one embodiment, each of source/drain regions 16, 18 comprises at least one of elemental silicon and metal material extending completely through the respective source/drain region orthogonal to the current-flow direction (e.g., material in portions 26 and 28). Further, insulator intervening region 78 extends beyond opposing outermost edges 79, 81 of conductive material 34 of transistor gate construction 30 in current-flow direction 20. Further, each source/drain region 16d, 18d comprises a pair of extending portions 83, 85 that are each elongated in current-flow direction 20, with insulator intervening region 78 that extends beyond opposing outermost edges 79, 81 in current-flow direction 20 being between the pair of extending portions 83, 85 in the vertical cross-section. Intervening region 78 being an insulator between extending portions 83, 85 is inoperative in functioning as source/drain material and accordingly is not part of either source/drain region of transistor 12d. In one embodiment, extending portions 83, 85 in one of vertical cross-section or horizontal cross-section are in the form of an annulus.

Any other attribute(s) or aspect(s) as shown and/or described herein with respect to other embodiments may be used.

Figure 12:
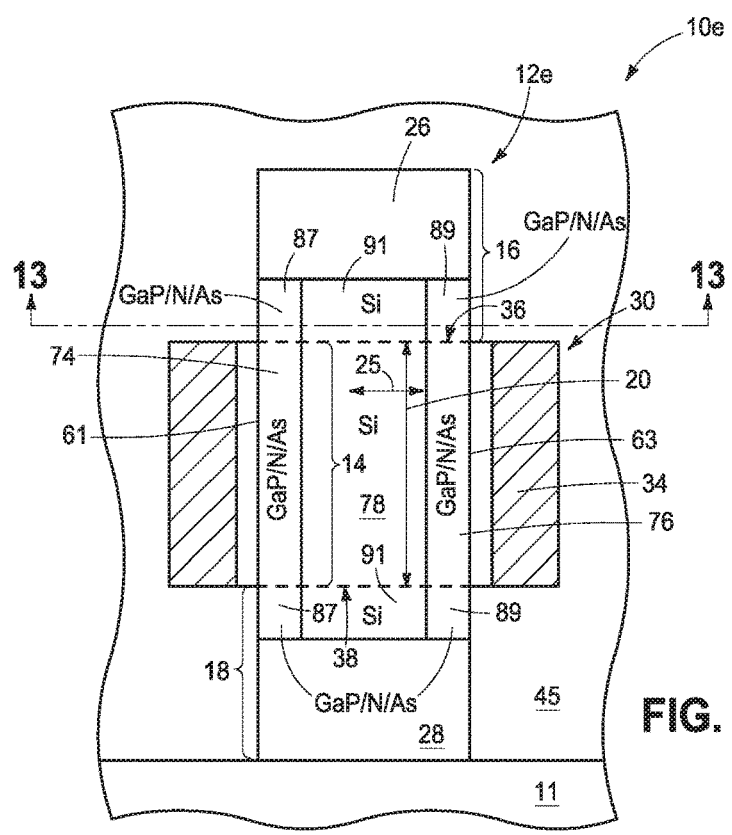
FIG. 12 is a diagrammatic cross-sectional view of a transistor in accordance with an embodiment of the invention, and is taken through line 12-12 in FIG. 13.
Figure 13:
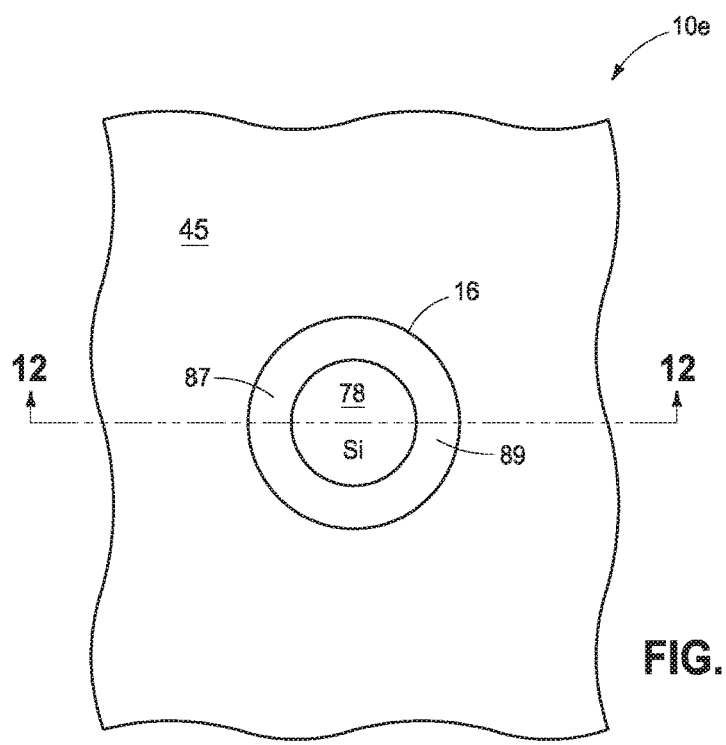
FIG. 13 is a cross-sectional view taken through line 12-12 in FIG. 9.
Figure 14:
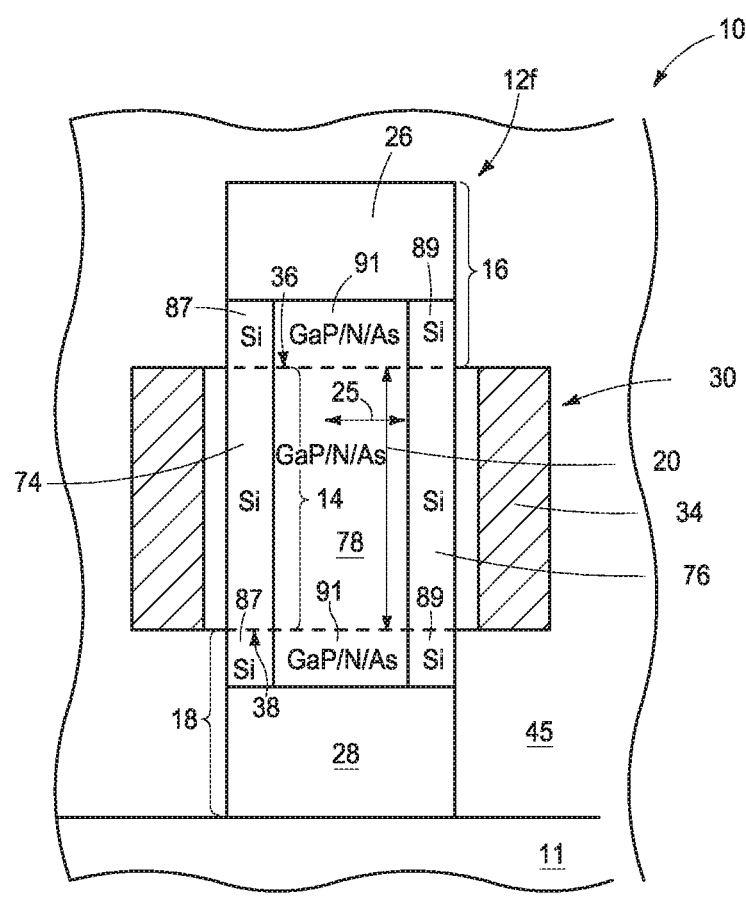
FIG. 14 is a diagrammatic cross-sectional view of a transistor in accordance with an embodiment of the invention.

Additional constructions 10e and 10f of additional transistors 12e and 12f, respectively, in accordance with embodiments of the invention are next described with reference to FIGS. 12-14. Like numerals from the above-described embodiments have been used where appropriate, with some construction differences being indicated with the suffix "e", "f", or with different numerals. Transistors 12e and 12f have opposing side regions 74, 76 extending all along current-flow direction 20. Transistor gate construction 30 is operatively proximate each of opposing side regions 74 and 76. Channel region 14 of transistors 12e and 12f comprises an intervening region 78 extending all along current-flow direction 20 between opposing side regions 74 and 76 in the vertical cross-section. One of (a) opposing side regions 74, 76 or (b) intervening region 78 comprises one of (i) at least one of GaP, GaN, and GaAs extending all along current-flow direction 20 or (ii) elemental silicon extending all along current-flow direction 20. The other of the (a) or (b) comprises the other of the (i) or (ii). FIGS. 12 and 13 show an example embodiment transistor 12e wherein the one of the (a) or (b) is (a): opposing side regions 74 and 76 comprise at least one of GaP, GaN, and GaAs extending all along current-flow direction 20 and (b) intervening region 78 comprises elemental silicon extending all along current-flow direction 20. Example transistor construction 12f of FIG. 14 shows the opposite. Intervening region 78 may comprise, consist essentially of, or consist of the (i) or the (ii). Opposing side regions 74, 76 may comprise, consist essentially of, or consist of the (i) or the (ii).

In one embodiment, each of source/drain region 16, 18 comprises at least one of elemental silicon and metal material extending completely through the respective source/drain region orthogonal to the current-flow direction (e.g., material in portions 26 and 28). Further, source/drain regions 16, 18 comprise a pair of opposing side regions 87, 89 in the vertical cross-section. An intervening region 91 is between source/drain opposing side regions 87, 89 in the vertical cross-section. One of (c) the source/drain opposing side regions 87, 89 or (d) source/drain intervening region 91 comprises one of (iii) at least one of GaP, GaN, and GaAs or (iv) elemental silicon. The other of the (c) or (d) comprises the other of the (iii) or (iv). FIGS. 12 and 13 show an example embodiment transistor 12e wherein the one of the (c) or (d) is (c): source/drain opposing side regions 87, 89 comprise at least one of GaP, GaN, and GaAs and (d) intervening region 91 comprises elemental silicon. Example transistor construction 12f of FIG. 14 shows the opposite. In one embodiment, opposing side regions 87, 89 in one of vertical cross-section or horizontal cross-section are in the form of an annulus. Intervening region 91 may comprise, consist essentially of, or consist of the (iii) or the (iv). Opposing side regions 87, 89 may comprise, consist essentially of, or consist of the (iii) or the (iv)

In one embodiment, source/drain opposing side region 87, 89 of each of source/drain regions 16, 18 and source/drain intervening region 91 of each source/drain region 16, 18 are in current-flow direction 20 between, and in one embodiment directly against, channel region 14 and the respective at least one of elemental silicon and metal material extending completely through the respective source/drain region orthogonal to the current-flow direction.

Any other attribute(s) or aspect(s) as shown and/or described herein with respect to other embodiments may be used.

In one embodiment, an elevationally-extending transistor (e.g., 12, 12a, 12b, 12c, 12d, 12e, or 12f) comprises an upper source/drain region (e.g., 16 or 16d) a lower source/drain region (e.g., 18 or 18d), and a channel region (e.g., 14, 14a, 14c, or 14d) extending elevationally there-between. The channel region comprises a top (e.g., 36) and a bottom (e.g., 38) each comprising at least one of GaP, GaN, and GaAs. A transistor gate construction (e.g., 30, 30a, or 30b) is operatively laterally proximate the channel region. The upper source/drain region comprises a lowermost portion (e.g., 22 or 83/85) comprising a top (e.g., 40) and a bottom (e.g., 42) each comprising at least one of GaP, GaN, and GaAs. The bottom of the lowermost portion of the upper source/drain region is directly against the at least one of the GaP, the GaN, and the GaAs of the top of the channel region. The upper source/drain region comprises an uppermost portion (e.g., 26) comprising a bottom (e.g., 44) comprising at least one of elemental silicon and metal material directly against the at least one of the GaP, the GaN, and the GaAs of the top of the lowermost portion of the upper source/drain region. The lower source/drain region comprises an uppermost portion (e.g., 24 or 83/85) comprising a top (e.g., 48) and a bottom (e.g., 50) each comprising at least one of GaP, GaN, and GaAs. The top of the uppermost portion of the lower source/drain region is directly against the at least one of the GaP, the GaN, and the GaAs of the bottom of the channel region. The lower source/drain region comprises a lowermost portion (e.g., 28) comprising a top (e.g., 52) comprising at least one of elemental silicon and metal material directly against the at least one of the GaP, the GaN, and the GaAs of the bottom of the uppermost portion of the lower source/drain region. Any other attribute(s) or aspect(s) as shown and/or described herein with respect to other embodiments may be used.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", extend(ing) horizontally, and horizontally-extending with respect to a field effect transistor are with reference to orientation of the transistor's channel length along which current flows in operation between the source/drain regions. For bipolar junction transistors, "extend(ing) elevationally" "elevationally-extending", extend(ing) horizontally, and horizontally-extending, are with reference to orientation of the base length along which current flows in operation between the emitter and collector.

Further, "directly above" and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "under" not preceded by "directly" only requires that some portion of the stated region/material/component that is under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Further, unless otherwise stated, each material may be formed using any suitable or yet-to-be-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other, and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Additionally, "metal material" is any one or combination of an elemental metal, a mixture or an alloy of two or more elemental metals, and any conductive metal compound.

CONCLUSION

In some embodiments, a transistor comprises a pair of source/drain regions having a channel region there-between. A transistor gate construction is operatively proximate the channel region. The channel region comprises a direction of current flow there-through between the pair of source/drain regions. The channel region comprises at least one of GaP, GaN, and GaAs extending all along the current-flow direction. Each of the source/drain regions comprises at least one of GaP, GaN, and GaAs extending completely through the respective source/drain region orthogonal to the current-flow direction. The at least one of the GaP, the GaN, and the GaAs of the respective source/drain region is directly against the at least one of the GaP, the GaN, and the GaAs of the channel region. Each of the source/drain regions comprises at least one of elemental silicon and metal material extending completely through the respective source/drain region orthogonal to the current-flow direction.

In some embodiments, a transistor comprises a pair of source/drain regions having a channel region there-between. A transistor gate construction is operatively proximate the channel region. The channel region comprises a direction of current flow there-through between the pair of source/drain regions. The channel region in the current-flow direction comprises a pair of outer regions having in the current-flow direction an intervening region there-between. Each of the outer regions comprises at least one of GaP, GaN, and GaAs extending completely through the channel region orthogonal to the current-flow direction. The intervening region comprises elemental silicon extending completely through the channel region orthogonal to the current-flow direction. Each of the source/drain regions comprises at least one of GaP, GaN, and GaAs directly against the at least one of the GaP, the GaN, and the GaAs of one of the outer regions of the channel region. Each of the source/drain regions comprises elemental silicon outward in the current-flow direction of the at least one of the GaP, the GaN, and the GaAs of the respective source/drain region.

In some embodiments, a transistor comprises a pair of source/drain regions having a channel region there-between. The channel region comprises a direction of current flow there-through between the pair of source/drain regions. The channel region has opposing side regions in vertical cross-section extending all along the current-flow direction. The opposing side regions each comprise at least one of GaP, GaN, and GaAs extending all along the current-flow direction. A transistor gate construction is operatively proximate each of the opposing side regions. An insulator intervening region extends all along the current-flow direction between the opposing side regions in the vertical cross-section.

In some embodiments, a transistor comprises a pair of source/drain regions having a channel region there-between. The channel region comprises a direction of current flow there-through between the pair of source/drain regions. The channel region has opposing side regions in vertical cross-section extending all along the current-flow direction. The channel region comprises an intervening region extending all along the current-flow direction between the opposing side regions in the vertical cross-section. A transistor gate construction is operatively proximate each of the opposing side regions. One of (a) the opposing side regions or (b) the intervening region comprises one of (i) at least one of GaP, GaN, and GaAs extending all along the current-flow direction or (ii) elemental silicon extending all along the current-flow direction. The other of the (a) or (b) comprises the other of the (i) or (ii).

In some embodiments, an elevationally-extending transistor comprises an upper source/drain region, a lower source/drain region, and a channel region extending elevationally there-between. The channel region comprises a top and a bottom each comprising at least one of GaP, GaN, and GaAs. A transistor gate construction is operatively laterally proximate the channel region. The upper source/drain region comprises a lowermost portion comprising a top and a bottom each comprising at least one of GaP, GaN, and GaAs. The bottom of the lowermost portion of the upper source/drain region is directly against the at least one of the GaP, the GaN, and the GaAs of the top of the channel region. The upper source/drain region comprises an uppermost portion comprising a bottom comprising at least one of elemental silicon and metal material directly against the at least one of the GaP, the GaN, and the GaAs of the top of the lowermost portion of the upper source/drain region. The lower source/drain region comprises an uppermost portion comprising a top and a bottom each comprising at least one of GaP, GaN, and GaAs. The top of the uppermost portion of the lower source/drain region is directly against the at least one of the GaP, the GaN, and the GaAs of the bottom of the channel region. The lower source/drain region comprises a lowermost portion comprising a top comprising at least one of elemental silicon and metal material directly against the at least one of the GaP, the GaN, and the GaAs of the bottom of the uppermost portion of the lower source/drain region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A transistor comprising:
 a pair of source/drain regions having a channel region there-between;
 a transistor gate construction operatively proximate the channel region;
 the channel region comprising a direction of current flow there-through between the pair of source/drain regions, the channel region comprising at least one of GaP, GaN, and GaAs extending all along the current-flow direction;
 each of the source/drain regions comprising at least one of GaP, GaN, and GaAs extending completely through the respective source/drain region orthogonal to the current-flow direction, the at least one of the GaP, the GaN, and the GaAs of the respective source/drain region being directly against the at least one of the GaP, the GaN, and the GaAs of the channel region;
 each of the source/drain regions comprising at least one of elemental silicon and metal material extending completely through the respective source/drain region orthogonal to the current-flow direction;
 the channel region as respects GaP, GaN, and GaAs comprising only one of the GaP, the GaN, and the GaAs extending all along the current-flow direction; and
 as respects GaP, GaN, and GaAs, each of the source/drain regions comprising only one other of the GaP, the GaN, and the GaAs extending completely through the respective source/drain region orthogonal to the current-flow direction.

2. The transistor of claim 1 wherein the at least one of the elemental silicon and the metal material of the respective source/drain region is directly against the at least one of the GaP, the GaN, and the GaAs of the respective source/drain region.

3. The transistor of claim 1 wherein one of the source/drain regions comprises elemental silicon and the other source/region consists essentially of metal material.

4. The transistor of claim 1 wherein the transistor is elevationally-extending.

5. The transistor of claim 1 wherein the transistor is horizontally-extending.

6. The transistor of claim 1 wherein the gate construction is over laterally-opposing sides of the channel region in straight-line vertical cross-section.

7. The transistor of claim 6 wherein the gate construction is over only two laterally-opposing sides of the channel region in straight-line vertical cross-section.

8. The transistor of claim 6 wherein the gate construction completely encircles the channel region in all straight-line vertical cross-sections.

9. The transistor of claim 1 wherein the gate construction is over only one lateral side of the channel region in straight-line vertical cross-section.

10. The transistor of claim 1 wherein the direction of current flow is straight-linear.

11. The transistor of claim 1 wherein the transistor is a thin-film transistor.

12. The transistor of claim 1 wherein the channel region comprises GaP extending all along the current-flow direction.

13. The transistor of claim 1 wherein the channel region comprises GaN extending all along the current-flow direction.

14. The transistor of claim 1 wherein the channel region comprises GaAs extending all along the current-flow direction.

15. The transistor of claim 1 wherein the source/drain regions comprise GaP extending completely through the respective source/drain region orthogonal to the current-flow direction.

16. The transistor of claim 1 wherein the source/drain regions comprise GaN extending completely through the respective source/drain region orthogonal to the current-flow direction.

17. The transistor of claim 1 wherein the source/drain regions comprise GaAs extending completely through the respective source/drain region orthogonal to the current-flow direction.

18. The transistor of claim 5 wherein the other source/drain region consists of metal material.

19. The transistor of claim 5 wherein the one source/drain region consists essentially of silicon and conductivity-enhancing impurity therein.

20. The transistor of claim 19 wherein the one source/drain region consists of silicon and conductivity-enhancing impurity therein.

21. The transistor of claim 1 wherein the channel region consists essentially of the one of the GaP, the GaN, and the GaAs extending all along the current-flow direction.

22. The transistor of claim 21 wherein the channel region consists of the one of the GaP, the GaN, and the GaAs extending all along the current-flow direction.

23. The transistor of claim 1 wherein the channel region consists essentially of the one of the GaP, the GaN, and the GaAs and conductivity-enhancing impurity therein extending all along the current-flow direction.

24. The transistor of claim 23 wherein the channel region consists of the one of the GaP, the GaN, and the GaAs and conductivity-enhancing impurity therein extending all along the current-flow direction.

25. The transistor of claim 1 wherein each of the source/drain regions consists essentially of the only one other of the GaP, the GaN, and the GaAs extending completely through the respective source/drain region orthogonal to the current-flow direction.

26. The transistor of claim 25 wherein each of the source/drain regions consists of the only one other of the GaP, the GaN, and the GaAs extending completely through the respective source/drain region orthogonal to the current-flow direction.

27. The transistor of claim 1 wherein each of the source/drain regions consists essentially of the only one other of the GaP, the GaN, and the GaAs and conductivity-enhancing impurity therein extending completely through the respective source/drain region orthogonal to the current-flow direction.

28. The transistor of claim 27 wherein each of the source/drain regions consists of the only one other of the GaP, the GaN, and the GaAs and conductivity-enhancing impurity therein extending completely through the respective source/drain region orthogonal to the current-flow direction.

* * * * *